United States Patent [19]

Lemelson

[11] 3,801,366

[45] Apr. 2, 1974

[54] METHOD OF MAKING AN ELECTRICAL CIRCUIT

[76] Inventor: Jerome H. Lemelson, 85 Rector St., Metuchen, N.J. 08840

[22] Filed: Feb. 16, 1971

[21] Appl. No.: 115,208

[52] U.S. Cl. .................................. 117/212, 117/93.3

[51] Int. Cl. .................................. B44d 1/18

[58] Field of Search ................ 117/212, 93.3, 93.31; 317/234 T, 234 V, 235 K; 96/38.4

[56] References Cited

UNITED STATES PATENTS

| | | | |
|---|---|---|---|
| 3,056,881 | 10/1962 | Schwarz | 117/93.3 |
| 3,169,892 | 2/1965 | Lemelson | 117/212 |
| 3,364,087 | 1/1968 | Solomon et al. | 117/107.2 |
| 3,461,347 | 8/1969 | Lemelson | 317/101 |
| 3,462,288 | 8/1969 | Schmidt et al. | 117/93.3 |
| 3,482,974 | 12/1969 | Metlay et al. | 96/35 |

*Primary Examiner*—Ralph S. Kendall

[57] ABSTRACT

A method of fabricating electrical circuits by converting circuit material to non-conducting and semiconducting compounds to vary the conductivity of the circuit material. In one form, a metal film is selectively converted to the metal oxide or a semi-conducting compound of the metal at selected portions thereof to form circuit elements connected by non-converted portions or to separate selected strip portions of the metal film from each other. In another form, polyconducting material is formed in situ on a substrate by chemical action converting a selected portion of a conducting strip to a polyconducting compound.

In the metal film conversion step, an oxidizing chemical is provided above a substrate or metal film and heat is selectively applied to a selected area or areas of the metal so as to create a chemical reaction between the metal and chemical at the temperature generated by the beam without substantially affecting and chemically converting other areas of the film. The same radiation, which may be generated as a beam, may also be used to erode portions of the metal film or deposite material onto selected areas of the substrate.

10 Claims, 14 Drawing Figures

INVENTOR.

JEROME H. LEMELSON

BY

INVENTOR.

JEROME H. LEMELSON

BY

METHOD OF MAKING AN ELECTRICAL CIRCUIT

SUMMARY OF THE INVENTION

This invention relates to methods for producing electrical circuits such as multi-layer and so called large scale integrated circuits by one or more techniques which are employed in sequence or, in certain instances, simultaneously and involve such operations as chemically converting selected portions of a circuit forming material such as a metal film applied to a substrate. In the parent applications defined above, electrical circuits are taught to be formed by disposing a sheet or film of metal on a substrate and converting selected portions of said metal to an oxide compound of the metal to form circuit leads, resistors, capacitors, inductors and tunnelling layers for circuit switching. The techniques described generally involve the use of a mask to permit oxidizing chemicals to react on selected areas of the metal film. In the instant invention, new and improved techniques for chemically changing or converting portions of conducting and semi-conducting material in situ on the substrate or previously formed circuit layer are provided which employ the selective application of heat to the substrate or layer thereon in the presence of a chemical which reacts with the conducting material at the temperature defined by the applied heat to form oxides and other compounds of the material on the substrate so as to provide various circuit components thereof. By employing very narro and defined beams of radiant energy such as generated by an electron gun or a laser and properly deflection controlling same or the substrate, substantially high resolution in circuit elements formed by said selective heating may be effected without resort to the use of a mask. The same or auxilliary beam may be used to control the conversion process, inspect the circuit formed, or machine the circuit or portions thereof by vaporization. The beam may also be used to implant or otherwise deposite or secure material to selected areas of the substrate.

Accordingly it is a primary object of this invention to provide a new and improved method for fabricating electrical circuits and circuit components.

Another object is to provide a method for producing micro-miniature circuits employing narrow radiation beams to perform a plurality of functions including heating selected areas of a substrate to convert portions thereof to semi-conducting or non-conducting material and perform auxillary functions such as eroding or vaporizing circuit forming material or selectively depositing or implanting same on a substrate or material deposited thereon.

Another object is to provide new and improved electrical circuit structures and apparatus for producing same.

Another object is to provide a method for producing electrical circuits by both variably deflection controlling and variably focusing one or more radiation beams to variably erode or convert selected portions of metal disposed on a substrate to non-conducting and semi-conducting materials and to variably erode or change portions of semi-conducting or non-conducting material applied to or formed on the substrate.

Another object is to provide a new and improved circuit and control arrangement therefore involving beam means for switching purposes.

The fabricating techniques defined hereafter may be employed to produce individual circuit components or large scale integrated electrical circuits containing oxide, polyconducting and semi-conducting materials which are chemically formed in situ directly on a substrate such as a chip or circuit board by one or more controlled techniques. Such circuit structures may include those provided in my parent U.S. Pat. Nos. 3,169,892 and 3,461,347 and in patent 3,325,733 including, in addition to thin film leads formed of plated, vapor deposited or laminated metal, such components as resistors, capacitors, inductors, tunnelling devices and switches to provide either major portions of or complete integrated circuits. While electron tunnelling devices may be formed in situ on a substrate by converting certain metals to oxide films of multi-angstrom thickness and using same to separate conducting strips, the techniques defined herein may be employed to provide so called polyconducting switching a control elements in situ by employing films or coatings of certain metals which may be so converted. Reference is made to volume 22, No. 18 May 1969 issue of Physical Review wherein is set forth a theory of electronic switching in an article by D. C. Mattis defining the electrical characteristics of polyconducting elements produced by the techniques set forth hereafter.

Figure 1:
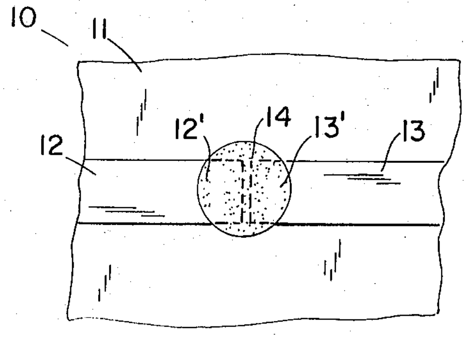
FIG. 1 is a plan view of a portion of an electrical circuit produced by a method defined herein.

In FIG. 1 is shown part of an electrical circuit assembly 10 which includes a substrate 11 such as a circuit board or other form of base support for a plurality of circuit elements, three of which are illustrated in the drawing, it being understood that said circuit elements may define a single component or may comprise extensions of similar or other circuit elements provided on the remainder of the base of substrate 11. A first thin strip 12 of metal is shown extending across the surface of the insulated substrate 11 and has its end portion 12' electrically connected to a film or sheet-like polyconducting material 14 shown as a circular formation thereof secured to the substrate 11. A second thin strip 13 of metal, preferably provided in film thickness, is shown aligned with the metal strip 12 and having its end portion 13 thereof electrically connected to the polyconducting material 14. The dimensions of the strips 12 and 13 and the polyconductor 14 are preferably such that the polyconductor 14 will gate or otherwise control the flow of electrical energy between the strips 12 and 13 in a predetermined manner. In one form of the construction shown in FIG. 1, the polyconductor 14 may be deposited so as to overlap the ends 12′ and 13′ of the strips 12 and 13, as illustrated, completing an electrical circuit with said strips 12 and 13.

In another form of construction, the ends 12′ and 13′ of the strips 12 and 13 may extend to and form a connected interface with edge portions of the polyconductor 14. In a particular form of this latter structure, the strip 12 and 13 and the polyconductor 14 may all be of the same thickness. In such construction, if the area 11′ of the surface of the substrate 11 adjacent to the elements 12, 13 and 14 is filled in with an insulating material of the same thickness as the elements 12, 13 and 14, an entire circuit may be formed in which all the components remain within a particular stratum above the surface of the substrate 11, thereby permitting the multiple stacking of layers of circuits similarly formed without components of one layer extending into the layer of the next circuit stratum.

The polyconducting material defining element 14, as well as any of the other polyconducting elements defined elsewhere herein, may comprise any one of a variety of polyconducting materials as defined, for example, in the May 5, 1969 issue of the Physical Review, Volume 20–22, pages 936ff. Polyconducting materials which are applicable to electrical circuit manufacture include certain plastic polymers, as well as metal oxides. A suitable metal oxide applicable as a polyconducting material for use at so-called ambient temperatures is niobium oxide. Other polyconducting materials include iron oxide, titanium oxide and various transition-metal oxides, so called Mott insulators, semiconducting materials, salts and polymers. In one form of fabrication of the device illustrated in FIG. 1, as well as structures to be described, the strips 12 and 13 may be formed by selectively depositing on the substrate or by the selective erosion or etching of metal deposited as a sheet or film on the substrate to leave the strips 12 and 13 in place thereon. The polyconductor 14 may be deposited on the substrate across or between the ends of strips 12 and 13 through a suitable mask or by beam deposition means as defined in my said application Ser. No. 422,875. In one form of constructing the polyconductor, it may be selectively deposited as a spray or by printing metal oxide or the required polymer to the selected area. The polyconductor 14 may also be applied as a monomer which is polymerized in situ on the substrate by applying suitable radiation or catalyst means thereto. In a still further technique, the polyconductor 14 may originally be applied as a layer or film of metal by selective deposition as described above or selectively plating after which all or a portion of the upper stratum of said metal is converted to the polyconducting oxide of a metal by subjecting same, preferably through a mask, to an oxidizing chemical or atmosphere as defined in application Ser. No. 422,875 for a period of time necessary to convert that portion of the deposited material to the polyconducting metal oxide.

In a particular construction of the polyconductor, it is noted that portions of the deposited metal may remain unconverted to the oxide to facilitate or improve connection of the polyconductor 14 to the strips 12 and 13 and, or to predetermine the electrical characteristics of the polyconductor.

Figure 2:
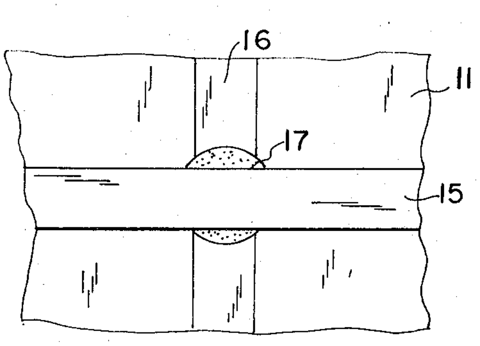
FIG. 2 is a plan view of another form of circuit.

In FIG. 2, a portion of an electrical circuit is shown which includes three circuit elements deposited on a substrate 11 or an insulated layer disposed above another layer of circuit elements. A first metal conducting strip 16 is disposed against and bonded to the upper surface of 11. Deposited on a portion of the upper surface of element 16 is a polyconducting material 17 which may be deposited as a polyconductor or converted to a polyconductor by one or more of the techniques defined above. Deposited or otherwise provided above the polyconductor 17 is a second strip element 15 which is separated from the conducting strip 16 by the polyconductor 17. The strips 15 and 16 are thus in an electrical circuit with each other through the polyconductor 17 and the structure illustrated in FIG. 2 may be utilized as a component or an electrical circuit such as a switching matrix whereby a signal applied to either of the strips 15 and 16 will be gated, amplified or otherwise controlled in its passage to the other strip through the polyconductor 17.

In the construction shown in FIG. 2, it is noted that either or both the strips 15 and 16 may terminate on the surface of the polyconductor 17 or extend therebeyond to further polyconductors.

Figure 3:
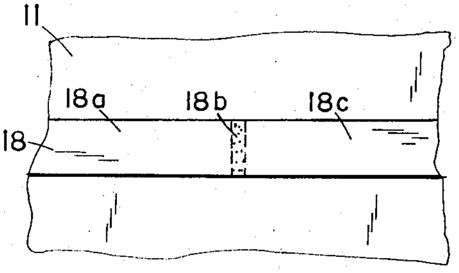
FIG. 3 is a plan view of a portion of another form of electrical circuit including a stirp partly converted to a polyconductor.

In FIG. 3 is shown a structure in an electrical circuit or circuit element disposed on a substrate 11 and formed by depositing or otherwise forming a strip 18 of metal such as niobium or other suitable metal which is convertible to a polyconducting material by oxidizing same. The strip 18 has a portion 18*b* thereof which is either partially or completely converted to a polyconducting oxide of said metal and remains electrically connected to the extensions 18*a* and 18*c* of the strip 18. The strip 18 thus defines either a circuit or a circuit component composed of a polyconductor defined by portion 18*b* thereof and connecting leads 18*a* and 18*c*.

If only a portion of the upper stratum of the portion 18*b* of the strip 18 is converted to its oxide by exposing same to a suitable oxidizing atmosphere, then a new type of circuit element is derived which includes both a polyconductor and a resistor connected in parallel with the lead portions 18a and 18*c* of the strip 18. The resistor is formed by that portion of 18*b* which have not been converted to the oxide, it being understood that said non-converted metal portion is of less thickness than the portions 18*a* and 18*c* and thereby defines a strip of metal of higher resistevity than the portions 18*a* and 18*c*. If metal is further deposited over the polyconductor portion of 18*b* and connects strip portions 18*a* and 18*c*, a polyconductor-capacitor circuit is provided which may also be utilized as a resistor-capacitor-polyconductor circuit.

Figure 4:
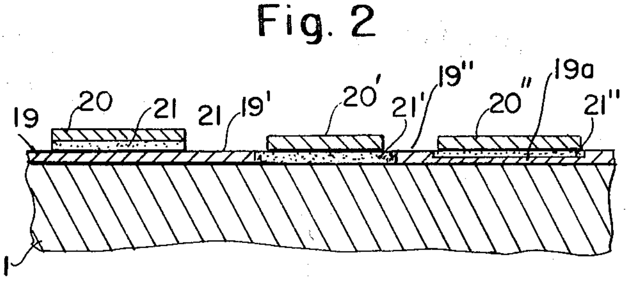
FIG. 4 is a side view in cross section of a fragment of an electrical device having polyconducting material formed in situ between strip elements or conductors.

FIG. 4 illustrates a modified form of electrical circuit employing polyconducting material formed of metal of one of the conducting elements deposited on a substrate and it is noted that the structure shown may be a modified form of that shown in FIG. 2. Deposited on the substrate 11 is a first metal strip 19 similar, for example, to strip 16 of of FIG. 2. Three constructions are illustrated for providing a polyconducting material or device between the strip 19 and respective strips 20, 20' and 20'' which cross over strip 19. The constructions illustrated in FIG. 4 may be utilized, for example, in the formation of so-called printed or integrated circuits or switching matrices.

In a first construction, a polyconducting material 21 is disposed on the upper surface 19' of strip 19 beneath a strip 20 of conducting material such as metal. The polyconducting material 21 may be formed of the metal strip 20 by the selective oxidation of said metal aligned with strip 19 or may be selectively deposited on said upper surface 19' prior to disposing strip 20 thereover such as by depositing same through a mask. The polyconducting material 21 thus serves to separate strip 19 from strip 20 and is in a series circuit with both said strips.

In a second structure illustrated in FIG. 4, a portion 21' of the strip 19 has been completely converted to a polyconducting compound of the metal of strip 19 by exposing that portion of strip 19 to a suitable chemical such as described, through an opening in a mask. A structure similar to that is shown in FIG. 3. After the formation of the polyconducting portion 21' of strip 19, the strip 20' of metal is deposited or otherwise disposed across strip 19 against the polyconducting portion 21' thereof and may or may not make direct electrical contact with strip 19, depending upon the characteristics desired of the electrical circuit formed thereof.

In a third construction illustrated in FIG. 4, a portion 21'' of the upper stratum of strip 19 is converted to polyconducting material by exposing it to a suitable chemical through a mask. The remaining portion of strip 19 below the portion 21'' is retained as a conductor and may be utilized as resistance in series with those portions of strip 19 on either side thereof. After forming the polyconducting stratum 21'' a strip of metal, denoted 20'', is deposited or otherwise disposed above the polyconducing material 21'' to form a series circuit with strip 19 separated therefrom by polyconducting strautm 21''.

In addition to utilizing certain of the multi-layer structures shown in FIG. 4 to form switching matrices by providing a plurality of parallel metal strips on a substrate which are crossed by other parallel strips and are separated at the cross-over areas by polyconducting material which may vary in thickness or other dimension so as to vary the switching value from cross-over to cross-over, the structures employing polyconducting layers 21' and 21'' may be utilized as variable electronic control devices in a variety of circuits. For example, elements 20' and 20'' may be used as control elements in electrical circuits where it is desired to vary the switching voltage across, for example, portions of the conducting strip 19 on both sides of the polyconducting material. If the element 20' is a resistence heating element which increases in temperature as the voltage or current thereof increases, then the voltage at which the polyconducting materials will conduct electrical energy between either elements 20' and 20'' and strip 19 or portions of strip 19 separated from each other by polyconducting material, will be a function of the current flowing through strips 20' and 20'' . If it is desired to form a thresh-hold switch between two portions of a strip of metal such as portions 19' and 19'' of strip 19 which are separated from each other by polyconducting material substantially narrower than portion 21' then an element such as 20' but no wider than 21' may be used as a control element. By increasing the voltage of strip 20', the voltage required to tunnell electrons or conduct between portions 19' and 19'' will correspondingly decrease. The structure employing polyconducting material may be similarly operated to permit the element 20 to serve as a control element and the device may be utilized somewhat in the manner of a triode.

In yet another arrangement, if the material 19*a* which remains of the conducting strip 19 after polyconducting stratum 20'' is formed thereof, serves as a resistence in a circuit composed of the portions of strip 19 on both sides thereof, then said resistence may be reduced or eliminated by applying sufficient current to strip 20'' to cause the oxide film 21' to conduct and, in effect, become metallic.

Figure 5:
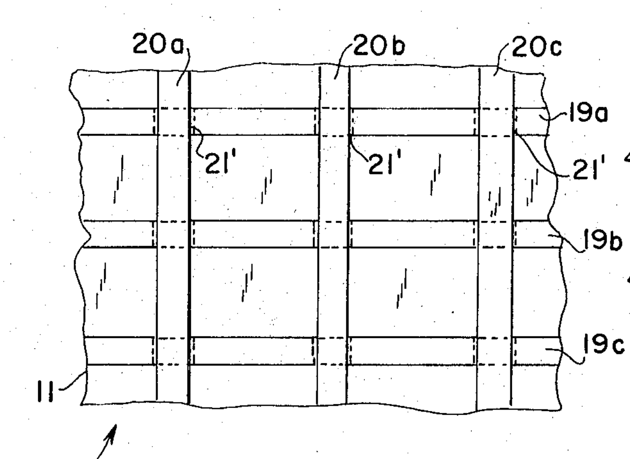
FIG. 5 is a plan view of a switching matrix.

In FIG. 5 is shown a switching matrix 10' formed of a substrate 11 having a plurality of conductors and polyconductors provided on its flat outer surface. A plurality of parallel first conductors such as strips of metal or metal film, denoted 19*a*,19*b*,19*c*, etc. are first deposited on the surface of substrate 11. Thereafter spaced apart portions 21'' of each of the strips 19*a*,19*b*,19*c*, etc., are converted to polyconducting film portions by exposing said portions to a suitable oxidizing atmosphere or chemical to form the oxide of the metal. The portion of each strip which are so converted are preferably aligned with each other as illustrated, so that a plurality of parallel strips of metal denoted 20*a*,20*b*,20*c*, etc., may be deposited or otherwise disposed above the portions 21'' of each of said metal strips which have been converted to polyconducting oxide films which are as wide as or wider than the strips 20*a*, 20*b* and 20*c* 1 are applied thereover to form the matrix. The switching matrix of FIG. 5 may also be made in accordance with the hereinabove teachings relating to the structures employing polyconducting portions or layers denoted 21 and 21' in FIG. 4. The shape and thickness of the polyconducting film portions 21'' formed in situ or deposited over the lowermost strips 19*a*,19*b*,19*c*, etc., of the substrate will determine the characteristics of the switching matrix and, as noted, film thickness and shape may be constant or vary from switching crossover to crossover. It is therefore noted that the switching characteristics of the polyconducting material and may be selectively tailored to attain different circuit characteristics.

Figure 6:
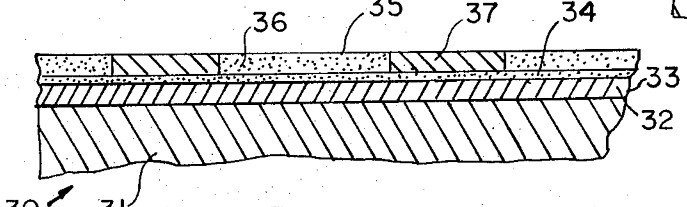
FIG. 6 is a side view in cross-section of a modified form of the circuit of FIG. 1.

In FIG. 6 is shown a modified form of a structure in a polyconducting switching matrix or control circuit of the type shown in FIG. 5. Whereas in FIG. 5, the conducting strips are provided by selectively depositing metal or selectively etching metal, in FIG. 6, a matrix of conducting strips separated where they cross each other by polyconducting material is formed of three layers of metal deposited one upon the other after certain portions of the previous layer have been converted to the non-conducting oxide of the metal. The total circuit structure of FIG. 6 is denoted 30 and is composed of a substrate 31 having a first layer 32 of metal deposited on a surface thereof. Thereafter, band-like portions (not shown) of the layer 32 are converted to non-conducting oxide of the metal as selectively exposing same to a suitable oxidizing atmosphere as defined in U.S. Pat. No. 3,169,892 leaving a plurality of parallel strip-like conducting metal portions 33 of said layer. In the next step, a layer 34 of polyconducting material of suitable thickness is either deposited in situ over the layer 32 or is formed in situ thereon from a thin film of metal which is converted to the polyconducting oxide of the metal by the means described. In the next step, a third layer 35 of metal is deposited over the layer 34 and parallel band-like portions 36 thereof are converted to a non-conducting oxide of the metal by, for example, the means described in U.S. Pat. No. 3,169,892 so as to leave parallel strip-like portions of conducting metal, denoted 37, on the polyconducting layer 34 and extending at an angle to the strip portions 33 of layer 32 to form a switching matrix composed of parallel conducting strips 33 separated from parallel conducting strips 37 by polyconducting material 34. Accordingly, a signal of sufficient voltage applied, for example, to one of the strips 37 may be passed to one or more of the strips in layer 32.

It is noted that, in a modified form of the switching matrices illustrated in FIGS. 5 and 6, the thickness of the polyconducting material separating each of the conducting strips of one layer from those of another, may vary from one junction to another either along a particular strip of one layer of along all strips. Thus, depending upon the characteristics and voltage of the applied signal, said signal will be passed to only that strip which it crosses which contains a polyconducting or tunneling layer which is equal to or less than the minimum thickness required to switch said signal. Logical switching circuits which employ voltage modulated signals may thus be constructed and utilized for various logical and computing functions.

Figure 7:
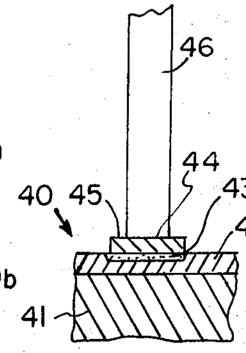
FIG. 7 is a side view in cross section of another circuit structure which may be used as an electronic gate or switch.

In FIG. 7 is shown a modified form of the instant invention which employs one or more conductors and a polyconductor disposed on a substrate. A conducting strip 42 is shown bonded to a substrate 41 and disposed above said conducting strip is a second conducting strip 44 separated from strip 42 by a polyconducting material 43 fabricated by one of the techniques described. Since the voltage at which tunneling occurs in the given polyconductor is a function of temperature, by increasing the temperature of the polyconductor, switching or tunneling in a given polyconductor may be made to occur for a given voltage within a particular range of voltages as defined by the characteristics of the polyconductor. Thus, if a voltage is applied to the conductor 44, for example, which is near the threshhold required to tunnel electrons through the polyconductor 43 to the conductor 42, the application of a sufficient amount of heat to raise the temperature of the polyconductor above the threshhold range would result in the tunneling of electrons through the polyconductor between the conductors separated thereby. Accordingly, in FIG. 7, an optical fiber 46 is shown having one end thereof in contact with or disposed immediately above the conductor 44 where it crosses conductor 42. By pulsing light energy through the optical fiber 46 from, for example, a laser, the energy of the light pulse may be generated as heat in conductor 44 which may be conducted to the polyconductor 43 and may be operative to effect switching or tunneling of electrons between the two conductors.

Figure 8:
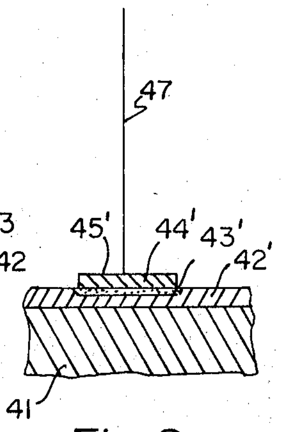
FIG. 8 is a side view of a modified form of FIG. 7.

In FIG. 8, a light beam 47 is shown directed against the upper surface 45' of a conductor 44' separated from a second conductor 42' by polyconducting material 43' as described. The energy of the pulsed beam 47 is converted to heat upon striking the conductor 44, which heat is sufficient to raise the temperature of the polyconducting material 43 a degree to effect switching or tunneling of electrons between the two conductors.

In another form of the inventions illustrated in FIGS. 7 and 8, it is noted that the electrically energized conductors 44 and 44' may be respectively replaced by photosensitive materials such as photo-transistors or other forms of photoelectric cells which are operative to generate an electrical potential when light of sufficient energy is directed thereagainst. Accordingly, the light generated in light pipe 46 or by beam 47 may be sufficient to generate a potential of sufficient voltage which tunnels through the polyconducting layers 43 and 43' when it reaches a particular value. The devices thus described may be utilized in computing and logical switching circuits employing combined optical and electrical operation.

Figure 9:
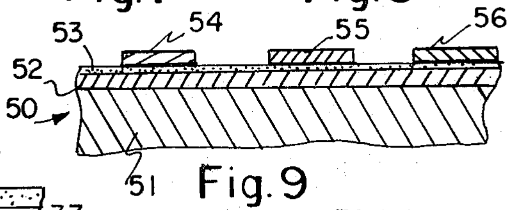
FIG. 9 is a side view of still another circuit structure.

FIG. 9 illustrates another form of the invention defining a portion of an electrical circuit assembly 50 formed with circuit elements 52,54,55 and 56 disposed on a substrate 51 as part of a larger array of circuit elements. Element 52 is composed of a sheet or film of metal bonded to the substrate 51 which is made of insulating material. The element 52 may be in the form of a strip or wide sheet or film of metal having covering its upper surface a layer 53 of polyconducting material as described. The polyconducting material 53 may be formed as a film by oxidizing the surface of element 52 prior to of after its assembly to the substrate 51. If the layer 52 is electrodeposited or vapor deposited metal such as iron, titanium, niobium or other suitable metal, the film 53 may be formed in situ, as described, by exposing the entire outer surface of metal layer 52 or just selected portions thereof to an oxidizing atmosphere for a suitable period of time. The surface of layer 52, for example if said metal is iron, may be exposed to moist air or moist oxygen for 10 to 30 minutes while said metal is heated to about 400° centegrade providing a reasonably coherent iron oxide ($Fe_3O_4$) film. Exposure may also be effect through openings in a mask or while selected areas of the layer 52 are coated with protective material to provide said oxide film on just selected areas of the metal. Thereafter strips 54,55 and 56 of any suitable conducting metal such as copper, aluminum, niobium or other metal may be bonded to the upper surface of layer 53 and the substrate from sheet metal or a layer thereof deposited in situ.

The electrical device 50 of FIG. 9 or modifications thereof may be operated in a number of modes to effect such functions as frequency and amplitude modulation, frequency conversion, gated oscillation, etc. For example, one of the strips such as 55 may serve as a control element by applying suitable voltages thereto so as to vary the gating characteristics of circuits including the other two strips.

Figure 10:
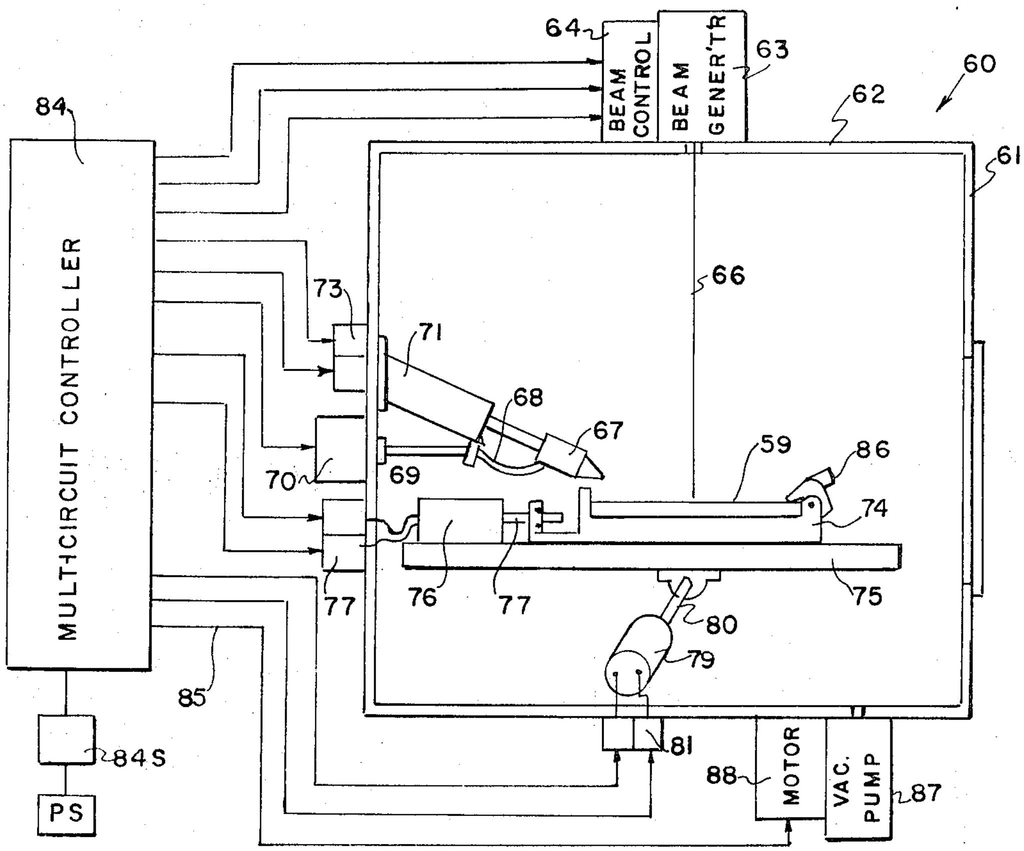
FIG. 10 is a schematic diagram showing apparatus for forming circuits of the types shown in FIG. 1 to 9 as well as other circuit structures by selective beam operation.

In FIG. 10 is shown an apparatus 60 for fabricating circuits and electrical components of the types described by employing an intense radiation beam such as a beam generated by a laser or electron gun 63 shown secured to a wall 62 of a housing 61. A substrate 59 in the form of a chip, group of chips, plate or otherwise shaped circuitboard is supported within the housing 61 on a multi-axis movable base or table 74 forming part of an apparatus 75 for prepositioning and, in certain fabricating procedures, predeterminately moving the substrate to cause it to either dispose different selected areas thereof in the path of the beam or to preposition such postions of the substrate requiring the fabricating techniques to be described hereafter to be performed by the beam pulsed thereagainst. The beam device 63 contains a housing 65 in which is disposed means for deflection controlling the beam in one or more directions in response to control signals generated on a control input or inputs thereto.

Table 74 is shown as being positionable in the X and Y horizontal directions by the controlled operation of respective gearmotors 76 and 79 having worm screw drives 77 and 80 connected for table movement on a further base and having control inputs 78 and 81 on which control signals may be generated to predeterminately position the table and substrate 59 thereon to allow the controlled beam to selectively heat, erode or otherwise affect the substrate and materials deposited or depositing thereon.

Certain of the fabrication techniques to be described hereafter will require the admission of one or more chemicals to either the chamber volume 61 so as to comprise an atmosphere therein of vapor or gas and/or a liquid to be sprayed or otherwise deposited onto the substrate's exposed upper surface or portions thereof or onto material disposed thereon. Accordingly one or more inlet devices such as nozzles or pipes may be fixedly or movable secured to the walls of the housing 61 and one such inlet device is shown in the drawing as composed of a nozzle 67 disposed at the end of a shaft 72 of a lineal actuator 71 which may comprise a motor or air cylinder operable to project the nozzle to a position above the substrate 59 so that it may be operated to spray or flow one or more chemicals onto the substrate at one or more predetermined times in a fabrication cycle. A control 73 for the actuator 71 may be energized and deenergized by signals generated by a master controller 84 such as a digital computer or program controller such as a multi-circuit, self resetting timer having outputs 85 connected to the beam control 64, the deflection control 65, the controls 78 and 80 for the motors 76 and 79 and a valve 83 connecting an outlet 82 to a vacuum pump or source of vacuum (not shown). An output of computer controller 84 also extends to a solenoid operated valve 70 connecting a supply of fluid to be admitted to the housing or substrate through the nozzle 67 by means of a flexible hose 68 connecting nozzle 67 to a fitting 69 secured to the side wall of the housing. A plurality of nozzles similar to 67 may be stationarily or movably mounted on the housing for admitting different chemicals simultaneously or separately to the housing and/or substrate by spraying or flowing same at predetermined times in a fabrication cycle while the beam 66 is generated or in between pulsings of the beam. Thus the apparatus of FIG. 10 or modifications thereto may be operated by program controlled operation of the motors, valves and beam generating means provided to perform one or more of the following fabrication functions:

A. The beam 66 may be predeterminately deflection controlled with or without controlled movement of the table 74 and substrate or chip array 59 thereon to intersect different areas of the substrate and erode same. Conducting metal film previously deposited on the substrate may be vaporized from selected areas of the substrate to leave circuit leads and components such as resistors and capacitors.

B. The beam 66 and/or table 75 may be predeterminately deflection controlled and positioned while a controlled atmosphere is generated above the substrate which is predeterminately secured to the table such that a chemical reaction is created on the substrate or metal film previously deposited thereon. Reactions created by the heat of the beam may include oxidation of portions of the metal film heated by the beam to generate complete oxide layers on selected portions of the substrate across which metal film may be deposited to form non-conducting junctions, polyconducting junctions or tunnelling layers for forming various electrical components such as resistors, capacitors, semiconducting components, etc.

C. The beam 66 may be predeterminately pulsed to intersect one or more selected spot areas of the substrate or film previously deposited thereon in a manner to effect the deposition of or implant material of the atmosphere above the substrate as admitted through one or more nozzles such as 67. A single pulse or plurality of pulses of intense beam energy may be used to implant or deposit selected amounts of material on the substrate or metal or semiconducting material disposed thereon by previous processing for doping same or otherwise forming various electrical components on the substrate such as switches, semiconducting elements or domains which respond to signals generated in the circuitry formed on the substrate. The beam may also be generated in such a manner as to scan a selected area or areas of the substrate for performing the above functions of causing the selective deposition or implantation of material from the atmosphere above the substrate.

D. The inlet nozzle 67 may be used to dispose one or more liquids as a film or films above the entire substrate 59 or selected areas thereof under computer or programmer control and the beam 66 may be predeterminately operated thereafter to cause a chemical reaction between the substrate or material previously deposited thereon such as a metal film and the chemical or chemicals flowed or sprayed onto the substrate to erode, oxidize, implant or otherwise affect said material and secure a predetermined amount thereof to a selected area or areas of the substrate. The beam in this example, heats the film of chemical or chemicals deposited on the substrate to create the chemical reaction and selectively deposite or change the composition of selected areas of the substrate or material previously deposited thereon.

E. Metal film may be selectively deposited from a film above the substrate by heat applied by means of a deflection controlled beam so as to form leads and components of a microminiature electrical circuit. Thereafter, one or more of the functions or operations defined in procedures denoted A–D above may be followed to complete the circuit. For example, an aluminum hydride solution may be sprayed or otherwise applied to a substrate by the nozzle means defined above together with or followed by a suitable catalyst such as titanium tetrachloride at an ambient temperature within the housing 61 below which a reaction will take place. Thereafter, the beam 66 is caused to scan a selected area or areas of the substrate above which the mixed film is deposited wherein the heat of the beam is operative to cause aluminum to deposite onto the substrate in direct alignment with the area or areas intersected by the beam. After the desired metal circuit components have been so deposited, the excess liquid chemical coating the surface of the substrate may be washed or blown off the substrate while in the housing or after removal therefrom. Thereafter, subsequent steps may include the implantation or deposition of other materials and other circuit forming techniques including repeating the above steps to form multiple layer circuits on the substrate. Notation 86 refers to a clamp for predeterminatly holding and prepositioning the substrate or chip base 59 on the table 75. It is noted that other devices may also be disposed in the housing or chamber 61 such as masks and transfer means for selectively depositing certain of the described materials or other materials to be plated, difused, implanted or otherwise selectively deposited on the substrate or previously deposited material.

F. In addition to or in place of the invention of a predetermined atmosphere above the substrate or a liquid film thereon which provides a source of material to be plated, implanted, otherwise coated or doped on or into the surface stratum of the substrate 59 as described herein, such material may also be provided as a sheet, thin film or wire disposed immediately above the substrate by a suitable controlled conveyor or manipulator. Direction of the intense laser or electron beam against an edge of or through such film or wire may be operative to vaporize and propell material thereof against a selected area or areas of the substrate so as to coat, plate, diffuse or implant a predetermined quantity of the material of the film, sheet or wire onto a selected area of the substrate. The material so plated, implanted or diffused may comprise a suitable metal such as a superconducting metal or junction metal such as copper, silver, gold or aluminum applied to form part of a semi-conducting device, lead, junction or the semi-conducting or switching device per se as it is deposited and/or after it is totally or partially converted to a semi-conducting material, polyconducting material or superconducting material in situ on the substrate by one or more of the herein provided techniques or other suitable means during or after the deposition is effected.

G. One or more nozzles or electron guns or electrode means may be provided within the chamber 61 of FIG. 10 for generating or conducting one or more beams of ions into or in the path of the beam 66 directed against a selected area of the substrate 59 to supply ion implantation material thereto. The ion generation and flow as well as the direction of the nozzle may be predeterminately controlled by the controller or computer 84 to effect the selective implantation or deposition of material on the substrate for manufacturing specific electrical devices or circuits.

H. In addition to automatically controlling the deflection or direction of the intense electron or laser light beam 66 and/or the movement of the table supporting the substrate 59 in two directions, it is noted that the beam 66 may be intensity controlled during a fabrication cycle either in accordance with a predetermined program as determined by a computer generating sequential command control signals as described and applied to suitable intensity control means located in the beam controller housing 64. Variation in beam intensity during a fabrication cycle may be employed, for example, to vary the depth of implantation of ions or the depth of diffusion of material as described or the rate of erosion of material or the rate and depth of conversion of the substrate or coating thereon to a polyconducting material, semiconducting material or oxide. Control of the beam shape including the location of its focus may also be automatically effected to predeterminately change the substrate or deposite material thereon, convert deposited material or implant material.

I. The same electron or laser beam used to deposit, diffuse or implant material on the substrate or a coating thereon may also be used to chemically change said deposited material or other material on the substrate, trim deposited material by vaporizing or chemically changing same so as to predetermined its shape and electrical characteristics and machine the substrate with cavities for the deposition of material thereon.

J. Deposition or implantation of material on the substrate may also be controlled by a feedback signal generated as a result of passing a current through the circuit element on the substrate being changed or connected to by material so deposited and analyzing the characteristics of the signal passed through the circuit being formed, the analysis including means for generating a reference signal and bucking the reference signal against the signal received in passing through the material being deposited so as to generate said feedback signal which is applied to a comparator circuit such as a summing amplifier which also receives the reference signal. The output of the comparator circuit is a difference signal which may be applied to control the operation of the beam generating means to control the duration and/or intensity of the beam 66.

K. In a particular circuit forming method, metal deposited on a substrate is partly converted to an oxide as described above or hereafter and further material such as metal, semi-conducing or polyconducting material is selectively deposited or implanted in the oxide so formed to form a semi-conducting circuit component per se or by further processing as described herein.

Additional features of the apparatus of FIG. 10 include the provision of a vacuum pump 87 operated by a motor 88 which is controlled to operate in a fabrication cycle by a signal generated on one of the outputs of the multi-circuit timer or computer 84 so as to predeterminately remove material from the atmosphere within the chamber 61. The pump 87 may thus be operated at predetermined times in a cycle of fabricating circuit elements to remove vaporized material formed within the chamber 61 by beam erosion or injected into the chamber 61 thru nozzle 67.

It is assumed that suitable power supplies are provided on the correct sides of all motors, controls, relays and the beam generator 63 of FIG. 10 to permit the proper operation thereof. A power supply PS is shown connected for operating the computer or controller 84 and connected thereto through a switch 84S which may be manually or automatically actuated by a signal generated by a limit switch operated when the door to the chamber 61 is closed or the next workpiece is in operative position within the chamber.

Figure 11:
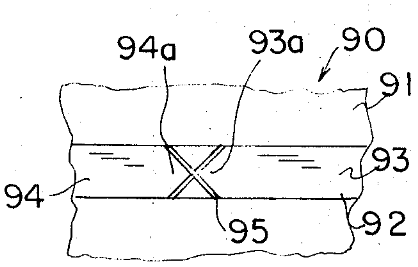
FIGS. 11 and 12 are plan views of structures in an electrical circuit produced by the method defined herein.

In FIG. 11 is shown a structure in an electrical circuit produced by selectively oxidizing a conducting metal strip on a substrate as described. The drawing shows a fragmentary portion of an electrical circuit 90 having a thin strip 92 of metal such as one of the hereinbefore described circuit metals applied as a film or layer on the surface of a substrate 91. The strip 92 is devided into portions 93 and 94 which are electrically insulated or separated from each other by an X-shaped portion of the original metal strip which is an oxide of the metal thereof. As a result the end portions 93*a* and 94*a* of strips 93 and 94 are V-shaped with the apices of the end portions closely adjacent each other and the remaining portions adjacent the apex of each strip portion separated by insulating and conducting material offering substantially resistivity to flow of current than the insulating material between the apices. The device 90 of FIG. 11 may be used as a switching device having unusual characteristics wherein a thin stream of electrons may be made to tunnel between the apices of each strip portion r wherein a semi-conducting or polyconducting material may be deposited, implanted or formed in situ between apices of the end portions 93*a* and 94*a* of strip portions 93 and 94.

Figure 12:
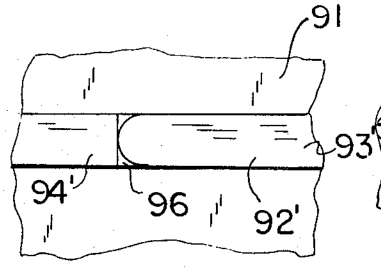

In FIG. 12, a conducting metal strip 92' is provided on a substrate 91 and is devided into separate segments 93' and 94' by conversion of a portion 96 of the strip to an oxide or semi-conducting compound of the metal. The end of portion 93' is shown as being rounded and just contacting or separated by a spacing from the straight end of strip portion 94' which is substantially tangent to or just off the circular end portion of 93'. The structure of FIG. 12 may be used to permit but a limited stream of electrons to flow between the portions 93' and 94' of metal strip 92' which flow may be commensed at a particular potential permitting the structure to serve as a switch or other form of control.

Figure 13:
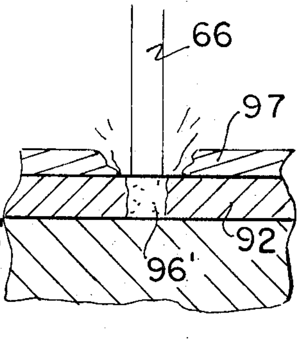
FIGS. 13 and 14 are side views showing circuit fabricating techniques as defined herein.

In FIG. 13 is shown the beam 66 of FIG. 10 passing thru a film or coating 97 of one or more of the herein described chemicals and intersecting as selected portion 96' of conducting strip 92 which portion is oxidized or otherwise converted to a compound of the metal as described to form an insulating, polyconducting or semi-conducting compound thereof. The portion 96' may extend completely or partially through the thickness of strip 92. Strip 92 may also comprise a semi-conducting material or insulating material wherein the portion 96' is reduced by heat and chemical action of film 97 to another compound or pure metal to provide an electrical circuit element or portion of a circuit element such as a switch, tunnelling device or diode or other device. In FIG. 13, a portion of the film or coating 97 may be plated, diffused or implanted in the layer 92 by the heat and shock wave generated by the beam 66 pulsed through film 97.

Figure 14:
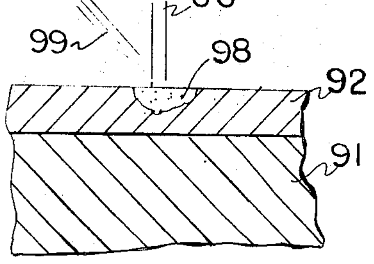

In FIG. 14 is shown the described circuit fabricating technique wherein an intense radiation beam implants, diffuses or deposits material on or in a substrate or coating thereon. The substrate 91 is shown having an outer stratum 92 or coating of metal, semiconducting or other material such as superconducting or magnetic material wherein a portion 98 thereof is converted in composition to a polyconductor, superconductor, insulating or other material by the action of a beam 66 as described and either or both matter defined by the gaseous or vaporous atmosphere existing above the surface of coating 92 and a stream 99 of molecules, particles, gas or vapor directed, for example, by the nozzle means of FIG. 10. The extent and composition of region 98 of material which differs from that of the remaining portion 92 of the strip or stratum on the surface of substrate 91 will be a function of the inensity and shape of beam 66, the time it is directed against 92 and the composition of the atmosphere and stream 99. The beam and/or substrate 91 may be predeterminately varied in relative position to predeterminately vary the shape of region 98.

In another form of the instant invention, it is noted that optical-electrical devices capable of performing functions such as those upon which the devices of FIG. 7 and 8 are operative or other computing and control functions may be fabricated by one or more of the following techniques:

I. a. A thin film of metal such as aluminum, nickel or other highly reflective metal is first deposited on a substrate.

b. Thereafter, a thin sheet of light-transmitting glass is bonded to or deposited on said substrate above said film.

c. Thereafter, portions of the glass film are removed by chemical and/or mechanical means to leave thin strip-like formations of light-transmitting glass, preferably extending parallel to each other and/or in a variety of predetermined circuits or directions across the substrate.

d. Thereafter, a thin film of metal is vacuum deposited or electroplated over the remaining glass strips so as to provide each strip completely surrounded by metal film having a high reflectivity.

e. The strips of glass so formed are thus each, in effect, a light pipe and each may have its ends connected to various optical and/or electro-optical means such as reflectors for reflecting light thereto or therefrom, polyconducting arrangements as described herein, light generating means such as semi-conducting lasing devices which may be formed in situ therein by deposition means or other devices operative to transmit light to and receive light from the strip-like light pipes described.

II. The techniques defined in the process denoted I may employ techniques for selectively depositing the glass strips or light-transmitting polymeric materials on a substrate and fabricating a plurality of light pipes thereof as described.

The polyconducting portions of the circuits or ciruit elements hereinabove described may also be formed of polyconducting polymers which are selectively deposited and/or selectively dissolved or eroded from the surface of the substrate.

Accordingly, one or more of the following techniques may be employed to form polyconducting circuits and other circuits as herein described:

I. A metal film deposited on a substrate or over a previously formed or deposited layer defining a circuit on said substrate may be selectively oxidized and/or eroded to form electrical circuitry composed of conducting metal strips and one or more polyconductors defining electrical switches, tunnelling devices, diodes and the like per se or in combination with resistance circuit elements, inductors and capacitors deposited or formed in situ thereon.

Depending on the oxidizing materials employed in the atmosphere or liquid disposed above the substrate, certain portions of a metal film may be converted to a non-conducting, non-polyconducting oxide of the metal to first form non-circuit portions of the deposited material between strip-like conducting and/or polyconducting portions remain on the substrate which are connected to lateral strip-like polyconducting portions or conducting material remaining on the substrate. In other words certain oxidizing or conversion compounds may be used which will convert selected portions of a metal film or coating disposed on a substrate to non-conducting or insulating material while other oxidizing compounds are employed which will convert portions of the metal on the substrate to polyconducting material to form other portions of the circuitry, the materials being applied through masks and or as defined above in the presence of controlled radiation beams to controllably heat and convert the metal to the compounds thereof. Thus fabrication techniques may include both the use of masks and selective beam heating to selectively apply conversion chemicals and selectively heat same.

II. If polyconducting plastics are employed in combination with metal films or conducting plastics to form circuits on a substrate, they may be selectively deposited through a mask or by the controlled direction of streams of aerosoled droplets of said plastics of the monomer thereof so as to predeterminately form films of polyconducting material on the surface of the substrate and disposed between conducting strips as described herein. If the monomer of a polyconducting plastic is employed, it may be converted to a polyconducting polymer after being so disposed by exposing the surface of the substrate or monomer to suitable irradiation or suitable gas or vapor which is operable to convert the monomer to the polymer.

III. Circuits of polyconducting material occupying selected areas of a substrate may be formed by depositing same on a larger area than needed and selectively eroding portions of the polyconductor and/or metal so deposited by means of the controlled scanning of the film deposited with an intense laser beam or electron beam as described. The beam may be used to vaporize or erode metal film, polyconducting plastic, or other circuit material to form circuit elements thereof.

Monomer vapor flowed from a nozzle or otherwise forming an atmosphere above the substrate may be converted to a polymer and deposited against selected areas of the substrate by a controlled electron or laser beam operated as herein described.

Metal film may be vapor deposited above a substrate containing polyconducting polymer elements previously deposited thereon. Such deposition may be through a mask to form conducting leads for the polyconducting plastic elements or may be selective converted to oxides as described herein.

IV. Intense radiation such as intense infra-red radiation, directed through a mask, may be utilized to vaporize and/or convert portions of metal or plastic film to polyconducting materials to form the circuits described.

V. In another technique, a monomer may be deposited as a thin film onto a substrate and selected portions of the film may be converted to a polyconducting polymer to form discrete polyconductors. The non-polymerized monomer may be washed, blown, wiped or otherwise removed from the substrate. A circuit or circuits may be formed by depositing said monomer over circuit elements such as a thin film circuit after which just those portions of the monomer film disposed above or across selected circuit elements are polymerized to form polyconducting units of the desired configurations. In another method, the polyconducting circuit elements so formed may have circuit elements such as metal leads and other elements deposited or otherwise disposed thereover after the non-polymerized monomer is removed. Radiation selectively directed as an electron or laser beam or from a source through a mask may be utilized to polymerize said monomer to convert it to said polyconductor elements. In another embodiment, a metal film may be deposited over the polyconductor elements formed on the substrate and may be selectively eroded or vaporized to form a circuit or circuits with the polyconductors.

In any of the aforedescribed techniques, semiconducting or magnetic materials may be selectively deposited on the substrate and/or over the circuit elements or polyconducting elements to form complete electronic circuits therewith.

VI. Polyconducting domains within the confines of conducting or semi-conducting material may be provided to form special electrical devices or circuits by one or more techniques. In a first technique, a metal conductor is provided in the form of a wire, strip, deposited film or other form and one or more portions thereof are converted to polyconducting domains operative to predeterminately affect the flow of current through the conductor or semi-conductor. Insulating or isolating domains, layers or other forms of insulating material may be formed in or on the conductor adjacent to or surrounding the polyconductor portions by deposition or by converting selected portions of the metal to non-conducting compounds of the metal.

VII. In yet another form of the invention, a metal film composed of a metal such as iron, titanium, niobium or other metal which will form a polyconductor such as an oxide thereof or other compound of said metal, may be sputtered or otherwise deposited on a substrate whereafter one or more electron beams and/or laser beams may selectively scan areas of the film to vaporize or erode portions thereof to form circuit elements while the same beam properly directed and energized in the presence of the suitable atmosphere adjacent the metal film may be utilized to form polyconducting compounds of selected areas of said film so as to form thin film or thick film electric circuits thereof.

VIII. Since niobium is a superconducting metal, superconductive switching devices and circuits employing niobium films formed or fabricated into leads or thin strip electrical circuit lines and separated or bridged from each other by portions thereof converted to niobium inch thick. as described or deposited as niobium oxide, amy be fabricated for use at superconducting temperatures. Thin films of silicon may also be selectively deposited on tin circuit elements and converted in situ to the oxide or monoxide to form superconductive switches with strips of lead deposited thereover although the conversion of a portion or portions of niobium strips to the oxide of niobium will eliminate the need to deposite additional material such as the silicon or silicon monoxide to form the tunnel or barrier layer. The described oxide or monoxide layers may be in the order of 0.00001 inch thick.

IX. In another circuit fabricating procedure, electro-optical devices and circuits may be produced in situ on a substrate by one or more of the following techniques:

a. An electrical circuit containing light emitting devices such as laser diodes and other solid state devices which generate light when electrically energized, is first formed or assembled onto a substrate after which or prior to the completion of the electro-optical circuit, a light conducting network is formed having a plurality of light pipes communicating with the light emitting devices on the substrate and operable as communication channels for conducting the light generated by a solid state or deposited emitter components to a light responsive light receiver or group of receivers forming part of the electrical circuit on the substrate. The light channels or pipes are formed in situ on the substrate by one or more of the following techniques:

i. A thin film of glass or light conducting plastic is either preformed and laminated to the substrate over the circuit elements or adjacent thereto or is coated from molten or solution state thereon covering either the entire substrate or a selected portion or portions thereof. Thereafter selected portions of the glass film or coating of plastic are removed by selective application of etchant or solvent through a mask or by the application of heat operative to vaporize or melt the glass or plastic so that it may be flowed or mechanically removed while the remaining portions which define strip-like formations of the film which vary from 0.001 inch to 0.010 inch or less in thickness and width extend in predetermined paths between electro-optical components for transmitting light generated thereby therebetween.

A cladding or coating of suitable material about said remaining strip-like formations of light conducting material of material having a higher refractive index than the material of the strip like formations may be effected as follows:

Prior to the cladding or coating of the glass or plastic against the substrate or circuit array disposed thereon, a thin coating of cladding material such as aluminum or other suitable material is disposed on the upper surface of said substrate or circuit array thereon to cover either the entire surface thereof or selected portions thereof such as the portions against which the strip-like formations of light transmitting material will eventually be disposed. Thereafter the hereinabove described steps of forming the strip-like of light transmitting material in situ above the portions of the substrate containing the cladding material are performed wherein the surface of the strip-like formations facing the substrate is suitably coated with cladding material. Thereafter suitable cladding material or metal film is deposited against the side walls and the top wall of each strip-like element remaining on the substrate by vapor deposition, electro-deposition or electroless deposition. In use of the electroless deposition technique, a metal hydride such as aluminum hydride is applied over or under a coating of a catalyst such as titanium tetrachloride and heated in the range of 100° to 200° F. to cause aluminum to deposit onto the side and upper walls of the glass or light conducting strip-like elements.

Three processes involving coating the upper and side walls of the light conducting strip-like elements are noted. In one, cladding material is selectively deposited through a mask only on the strip-like elements. Heat to precipitate the metal may be applied through the same mask used to selectively apply the hydride and catalyst. In a second technique, the metal hydride and catalyst may be deposited as a filam covering the entire surface of the substrate or a large portion thereof beyond the portions covered by the strip-like elements. Selective heating of the film may be effected by selectively scanning the film above the strip like elements with a laser or electron beam. In a third technique, portions of the cladding material between those portions covering the strip-like elements are etched away or converted to oxide film by the means defined herein.

ii. In a second technique, metal film is vapor deposited, electro-deposited or electrolessly deposited onto a substrate or a previous circuit layer on a substrate and two strip-like circuits are formed thereof. One circuit forms part of an electrical circuit as described which includes semi-conducting light generating elements and other elements mechanically secured or deposited across stirp-like leads formed of the metal film. The other circuit is composed of strip-like portions of the same metal film comprising the first circuit which define the under portions of the cladding to be applied under the light conducting strips which are applied thereafter thereover as described. These two separate metal film strip arrays may be electrically separated from each other or may be electrically connected whereby the cladding material or metal film forms electrical conducting paths as part of the electrical circuitry on the substrate. Thereafter further metal film is disposed above the light conducting elements as described.

iii. A monomer of a light conducting plastic may be coated on or disposed in the atmosphere above a substrate containing cladding material applied as described above. An electron beam or laser light beam or pattern of ultraviolet light energy is then applied to selected areas of the substrate to cause the monomer to be converted to the suitable light conducting polymer along the described strip-like portions thereof to form said strip-like light conducting elements above the strip-like or film of cladding material. The remaining excess monomer is removed and the above steps for cladding the upper surfaces of the strip-like polymer are effected to complete the light pipe array on the surface of the substrate.

iv. The light conducting strips defined above may also be formed on the substrate by disposing powdered glass or plastic material as either a layer above the entire substrate or by electrostatic deposition means along selected areas thereof and solidifying said powdered material by scanning same with an intense laser beam or electron beam along a path defining said conducting striplike elements so as to render said powdered material molten whereafter it solidifies into said strip-like light conducting elements.

v. The above described steps for providing strip-like light conducting elements on a substrate may be followed by additional steps of forming circuit elements such as conductors, resistors, capacitors, inductors, semi-conductors, etc. adjacent to and over the light conducting elements and optically coupling electro-optical light generators and receivers to the light conducting strips so deposited or formed on the substrate to form multilayer electrical and electro-optical circuits thereof. Semi-conducting transducers, solid state lasing material and photoelectric detecting materials and composites may be selectively deposited the the ends of or along selected portions of the strip-like light pipes formed as described above.

vi. Suitable light gating and modulating devices such as Kerr Cells and other electrically energized devices such as mirror containing oscillators may be deposited or otherwise disposed at the ends of the described light conducting strip-like elements for controlling and gating light passed from one element to the next. Light control may also be effected by modulating the light generating electro-optical lasing means described and by modulating the opto-electric receiving means disposed at the ends of or between certain of the light conducting elements.

In the process heretofore defined, the following sources of reference material are presented and form part of the instant disclosure.

1. Control and power means for intense radiation sources such as lasers may be found in the texts "A,B,C's of Lasers and Masers" (p.81, etc.) Howard W. Sams, Bobbs-Merrill and Company, New York, N.Y. ; "Laser Technology and Applications" by Samuel L. Marshall, McGraw Hill Book Company, New York, N.Y.

2. Electroless deposition of metal films employing metal hydrides and catalysts which serve to deposite the metal of the hydride on a surface may be found in U.S. Pat. No. 3,462,288 and in my copending application filed Sept. 22, 1970 entitled Apparatus and Method for Coating, Ser. No. 74,354, now abandoned.

I claim:

1. A method of forming an electrical circuit comprising:

providing a thin strip of electrical conducting material on a substrate, and completely converting a selected cross-sectional portion of said strip of electrical conducting material to a compound of said electrical conducting material which compound has substantially different conducting characteristics than the conducting characteristics of the material of the remaining portion of said strip while maintaining a portion of said original conducting material in electrical connection with the conducting converted cross-sectional portion thereof so as to form a series circuit between the remaining portion of the strip of said electrical conducting material and said compound thereof.

2. A method in accordance with claim 1 wherein said electrical conducting material is metal and the portion thereof converted is selectively changed in composition by the selective application of heat thereto.

3. A method in accordance with claim 2 wherein a radiation beam is controllably operated and made to intersect said selected cross sectional portion of said strip to heat same and effect the conversion thereof to said compound having different conducting characteristics than the metal comprising the remaining portion of said strip.

4. A method in accordance with claim 2 wherein said compound is a polyconducting material formed intermediate the ends of said strip and deviding the strip into two separate conducting portions, which are joined to said poly-conducting material.

5. A method in accordance with claim 1 wherein the conversion of said selected portion of said strip is effected by disposing a reaction material above said strip and causing said reaction material to react with the material of said strip to be converted to said compound thereof having different electrical conducting characteristics than the material of the remaining portion of the strip.

6. A method in accordance with claim 5 wherein said reaction material is disposed as a thin film on said strip.

7. A method in accordance with claim 5 wherein said reaction material is disposed above a substantially larger area of said strip than the area thereof aligned with the portion to be converted to said compound having different electrical conducting characteristics than the strip and reaction is effected by exposing the area aligned with the portion of the strip to be converted to radiation.

8. A method of selectively depositing material to a substrate comprising:

disposing a thin film of material containing a metal radical above a substrate, selectively scanning said film with a radiation beam so as to selectively heat and cause predetermined portions of the film to deposit metal therefrom onto predetermined portions of said substrate and removing the remainder of the undeposited material of the film from the substrate.

9. A method in accordance with claim 8 wherein the film is composed of a metal hydride and contains a catalyst which reacts with the metal hydride at a temperature greater than that at which it is disposed on said substrate, said radiation being such as to raise the temperature of the scanned portion of the film to cause the metal of the hydride to become deposited onto the substrate by chemical reaction between the hydride and the catalyst.

10. A method in accordance with claim 9 wherein said radiation is in the form of an intense beam of radiation such as generated by a laser or electron gun, further including relatively moving the beam and substrate to predeterminately scan the substrate with the beam and effect the deposition of metal onto predetermined areas of the substrate.

* * * * *